(12) United States Patent
Schultz et al.

(10) Patent No.: US 8,031,043 B2
(45) Date of Patent: Oct. 4, 2011

(54) ARRANGEMENT COMPRISING A SHUNT RESISTOR AND METHOD FOR PRODUCING AN ARRANGEMENT COMPRISING A SHUNT RESISTOR

(75) Inventors: Martin Schultz, Erwitte (DE); Peter Kanschat, Soest (DE)

(73) Assignee: Infineon Technologies AG, Neubiberg (DE)

( * ) Notice: Subject to any disclaimer, the term of this patent is extended or adjusted under 35 U.S.C. 154(b) by 848 days.

(21) Appl. No.: 11/970,661

(22) Filed: Jan. 8, 2008

(65) Prior Publication Data

US 2009/0174522 A1 Jul. 9, 2009

(51) Int. Cl.
*H01C 7/10* (2006.01)

(52) U.S. Cl. ............ 338/49; 338/328; 338/254

(58) Field of Classification Search .......... 338/49, 338/48, 22 R, 328, 332, 320, 254
See application file for complete search history.

(56) References Cited

U.S. PATENT DOCUMENTS

| | | | |
|---|---|---|---|
| 6,311,390 B1* | 11/2001 | Abe et al. | 29/612 |
| 6,556,123 B1* | 4/2003 | Iwao et al. | 338/22 R |
| 6,593,844 B1* | 7/2003 | Iwao et al. | 338/22 R |
| 7,075,408 B2* | 7/2006 | Mihara et al. | 338/22 R |

FOREIGN PATENT DOCUMENTS

JP 08-115802 A 5/2006

OTHER PUBLICATIONS

First Office Action issued Sep. 10, 2010 in re Patent Application No. CN200810185371.6 filed Dec. 22, 2008.

* cited by examiner

*Primary Examiner* — Kyung Lee
(74) *Attorney, Agent, or Firm* — Coats & Bennett, P.L.L.C.

(57) ABSTRACT

The invention relates to an arrangement comprising a shunt resistor with at least an electrically conductive first connecting leg and an electrically conductive second connecting leg. A resistance area of the shunt resistor is electrically connected to the first connecting leg and to the second connecting leg. The arrangement further comprises a circuit carrier with a first metallization and a second metallization. The first connecting leg is directly joined to the first metallization and the second connecting leg is directly joined to the second metallization. The resistance area of the shunt resistor is in thermal contact with the thermally conductive substrate by use of a thermal filler arranged between the resistance area and the substrate, and/or by directly contacting the resistance area with the substrate.

The invention further relates to a method for producing an arrangement with a shunt resistor and a circuit carrier.

29 Claims, 8 Drawing Sheets

US 8,031,043 B2

ARRANGEMENT COMPRISING A SHUNT RESISTOR AND METHOD FOR PRODUCING AN ARRANGEMENT COMPRISING A SHUNT RESISTOR

FIELD OF TECHNOLOGY

The invention relates to arrangements comprising a shunt resistor.

BACKGROUND

Shunt resistors are used to precisely determine electric currents, e.g. in power semiconductor modules. Conventional shunt resistors extend over a large area and are electrically connected, e.g., to a circuit carrier, by soldering. Physically, two conflicting properties are requested. First is a rather large electrical resistance to enable accurate current measurements. Second is a low thermal resistance to avoid overheating through the dissipated power. Since both properties do not combine well, shunt resistors usually heat up to high temperatures and therefore a degradation of the solder and, coming along therewith, delamination of the shunt resistor may arise. This is one of the reasons why shunt resistors generally are specified to certain maximum temperatures, e.g. 250° C.

SUMMARY

The present invention relates to an arrangement comprising a shunt resistor with at least an electrically conductive first connecting leg an electrically conductive second connecting legs and a resistance area. The resistance area is electrically connected to the first connecting leg and to the second connecting leg. The arrangement further comprises a circuit carrier with a first metallization and a second metallization. The first connecting leg is joined to the first metallization and the second connecting leg is joined to the second metallization. According to a first aspect of the invention, a cooling path from the resistance area to the circuit carrier is created. The cooling path may be realized by a heat conductive filler which is arranged between the circuit carrier and the resistance area. Just as well, the cooling path may be realized by a direct contact between the resistance area and the circuit carrier.

The invention further relates to a method for joining a shunt resistor and a circuit carrier. In the method, a shunt resistor comprising at least an electrically conductive first connecting leg, an electrically conductive second connecting leg, and a resistance area arranged between and electrically connected to the first connecting leg and the second connecting leg, are provided. Further, a circuit carrier comprising a first metallization and a second metallization is provided. The shunt resistor is positioned on the circuit carrier such that the first connecting leg is in contact with the first metallization and that the second connecting leg is in contact with the second metallization. Then, the first connecting leg is joined with the first metallization and the second connecting leg is joined with the second metallization by use of an ultrasonic bonding technique.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION OF THE INVENTION

Figure 1:
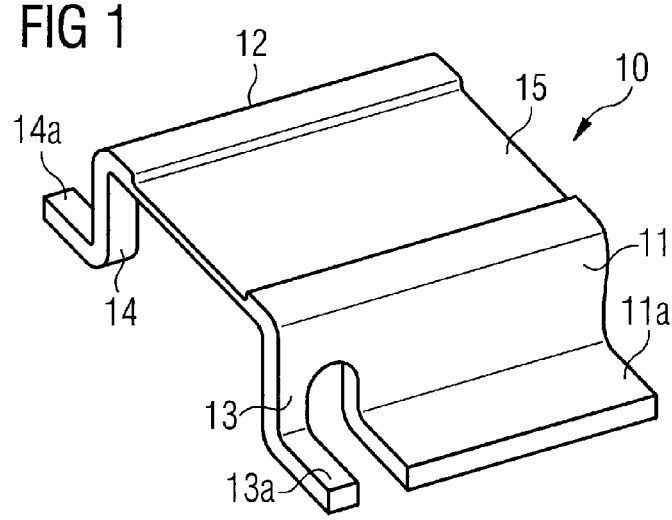
FIG. 1 is a perspective view of a shunt resistor comprising four connecting legs.

FIG. 1 is a perspective view of an example of a shunt resistor 10. The shunt resistor 10 comprises a first connecting leg 11, a second connecting leg 12, an optional third connecting leg 13, and an optional fourth connecting leg 14. Each of the connecting legs 11, 12, 13, 14 comprises a flange 11a, 12a (hidden in FIG. 1), 13a, and 14a, respectively. A resistance area 15, which has a predetermined electrical resistance, is arranged between the first connecting leg 11 and the second connecting leg 12, and between the third connecting leg 13 and the fourth connecting leg 14. Compared with the resistance area 15, the first connecting leg 11 and the second connecting leg 12 have a low electric resistance. The resistance area may be, e.g., built from a metallic alloy with low thermal dependence of the resistivity. Commercially available examples are Manganin® (comprising, e.g., about 82% by weight to 84% by weight of copper, 12% by weight to 15% by weight of manganese, and 2% by weight to 4% by weight of nickel), Constantan® (comprising, e.g., about 55% by weight of copper, 44% by weight of nickel and 1% by weight of manganese), and others.

If an electric current flows between the first connecting leg 11 and the second connecting leg 12 the current has to pass the resistance area 15. This will cause a voltage drop that may be measured whit a high-impedance voltage measuring device connected to the third connecting leg 13 and the fourth connecting leg 14. From the measured voltage and the known resistance of the resistance area 15 the electric current through the resistance area may be calculated precisely.

Figure 2A:
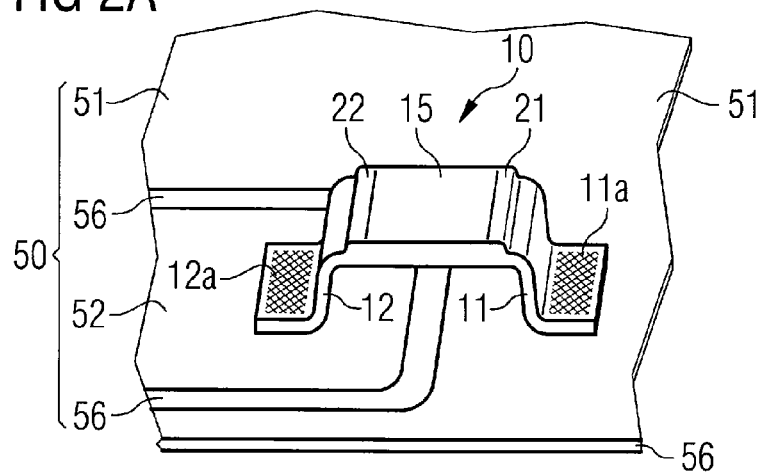
FIG. 2A is a perspective view of a shunt resistor joined to a circuit carrier, the shunt resistor comprising exactly two connecting legs.

FIG. 2A is a perspective view of another example of a shunt resistor 10. The shunt resistor 10, which is joined to a circuit carrier 50, comprises a first connecting leg 11 and a second connecting leg 12. The substrate 50 comprises a first metallization 51 and a second metallization 52 spaced distant from one another. The metallizations 51, 52 may comprise or consist of, e.g., copper or aluminum, and are attached to a substrate 56 which may be made of a thermally conductive dielectric material like $Al_2O_3$, $Si_3N_4$, AlN or other ceramics, but may also be made up of an IMS (Insulated metal substrate) or epoxy PCB board with thermal vias. The melting point of the metallizations 51, 52 is significantly higher than, e.g. 290° C., i.e. higher as the melting point of conventional solder.

The first connecting leg 11 may be directly ultrasonic bonded to the first metallization 51, the second connecting leg 12 may be directly ultrasonic bonded to the second metallization 52. "Directly" means that no other material is arranged between the connecting legs 11, 12 and the respective metallization 51 and 52, respectively. However, instead of a single layer only, the metallization 51, 52 may alternatively be designed as multilayer metallization comprising at least two sub-metallization layers. In the case of a shunt resistor 10 additionally comprising third and fourth connecting legs 13, 14, respectively, the additional legs 13, 14 may also be ultrasonic bonded directly to respective metallizations.

In FIG. 2A, the shunt resistor 10 additionally comprises a first bonding area 21 arranged between the first connecting leg 11 and the resistance area 15, and a second bonding area 22 arranged between the second connecting leg 12 and the resistance area 15. Both bonding areas 21, 22 are arranged close to the resistance area 15 and serve as bond pads to attach bonding wires for tapping the voltage drop across the resistance area 15. Optionally, the first bonding area 21 may be formed as plane surface section of the first connecting leg 11. Accordingly, the second bonding area 22 may optionally be formed as plane surface section of the second connecting leg 12. Such plane surface sections 21, 22 may run parallel to the circuit carrier 50. Further, such plane surface sections 21, 22 are large enough to allow the attachment of a bonding wire made of or comprising, e.g., aluminum, copper, or gold. The necessary size of such plane surface sections 21, 22 depends on the size of the bonding wire after bonding, and on the bonding process. For instance, for a 400 µm Al wedge bond, a bonding area in the order of >1000 µm×600 µm will be needed. Generally, the plane surface section 21, 22 may range from, e.g., 0.1 mm×0.1 mm to 0.8 mm×2.0 mm. Depending on the chosen material of the bonding wire, the metallization 51, 52 may comprise a coating layer, e.g. a Ni—Au plating, to improve bondability.

Figure 2B:
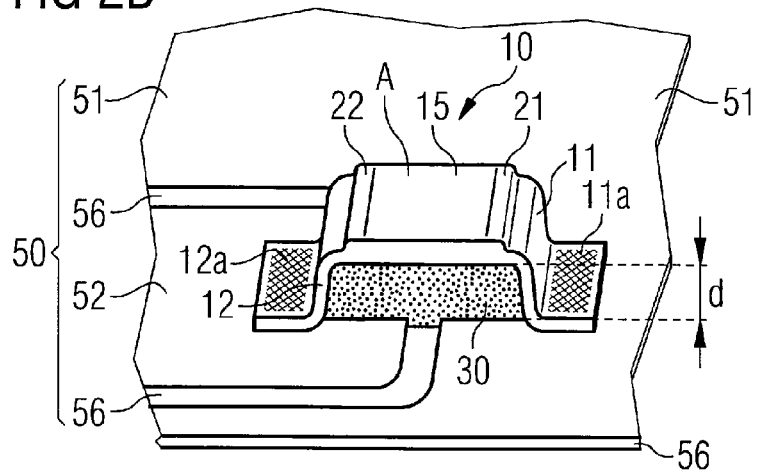
FIG. 2B shows the shunt resistor of FIG. 2A after arranging a heat conductive filler between the shunt resistor and the circuit carrier.

As shown in FIG. 2B, a heat conductive filler 30 may be arranged between the resistance area 15 and the circuit carrier 50 prior to or after bonding the shunt resistor 10 to the circuit carrier 50. The heat conductive filler 30 contacts with the circuit carrier 50 and with the resistance area 50. For example, the heat conductive filler 30 may have a thermal conductivity of greater than 1 $W \cdot K^{-1} \cdot m^{-1}$. More precisely, the thermal conductivity λ of the heat conductive filler must be chosen in a way such that the heat flow through the filler is a considerable share ΔP of the power P dissipated in the resistive region of the shunt. With A being the resistive area 15 of the shunt, d the perpendicular distance between the resistive area 15 and the circuit carrier 50, and ΔT the temperature rise of the resistive area 15 above the temperature of the circuit carrier 50, the required λ calculates to:

$$\lambda=(\Delta P \cdot d)/(\Delta T \cdot A) \quad (1)$$

As an example, removing 30% of a dissipated power of 8 W within a resistive area A of 25 $mm^2$, located 1 mm above the substrate with ΔT of 100 K requires λ=0.96 $W \cdot K^{-1} \cdot m^{-1}$.

If the heat conductive filler 30 is a dielectric, it may directly contact with the shunt resistor 30 and the metallizations 51, 52 without affecting the result of the resistance measurement. However, in case of an electrically conductively filler 30, insulation measures between the filler 30 and the metallizations 51, 52 and between the filler 30 and the resistance area 15 are required. In this case the filler's thermal conductivity λ according to eq. (1) must be calculated as an effective value of insulation and filler material.

A suitable material to be used as heat conductive filler 30 is, for example, ceramic material. The filler may consist of ceramic material or comprise at least 50% by weight of ceramic material.

Figure 3:
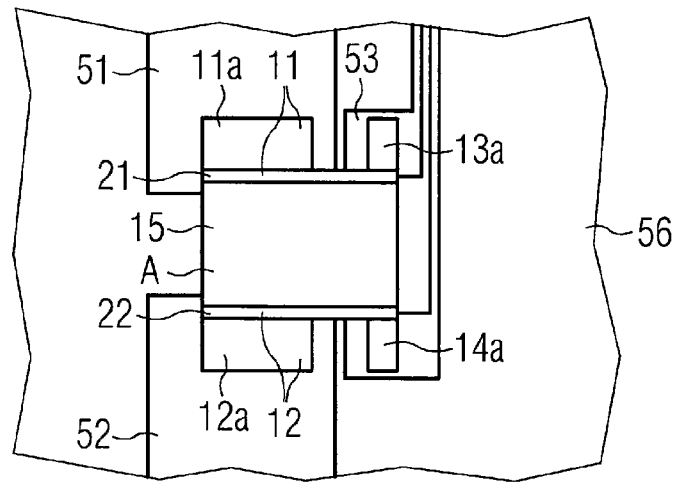
FIG. 3 is a top view of the shunt resistor of FIG. 1 connected to a circuit carrier.

FIG. 3 is a top view of the shunt resistor 10 of FIG. 1 connected to a circuit carrier 50. Here, the circuit carrier 50 comprises a dielectric ceramic layer 56 and metallizations 51, 52, 53, 54 joined with the dielectric ceramic layer 56. The flange 11a of the first connecting leg 11 and the flange 12a of the second connecting leg 12 are ultrasonic bonded to respective metallizations 51 and 52. Accordingly, the flanges 13a of the third connecting leg 13 and the flange 14a of the fourth connecting leg 14 are ultrasonic bonded to respective metallizations 53 and 54. The third connecting leg 53, the fourth connecting leg 54 and the metallizations 53, 53 are used for tapping the voltage drop across the resistance area 15. The shunt resistor comprises optional bonding areas 21, 22 which additionally or alternatively may be used for tapping the voltage drop across the resistance area 15.

Figure 4:
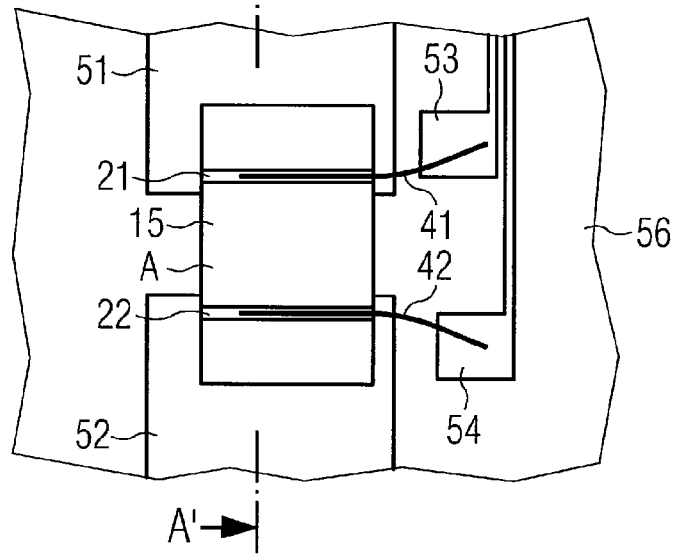
FIG. 4 is a top view of the shunt resistor of FIGS. 2A and 2B connected to a circuit carrier, the shunt resistor comprising two bonding areas electrically connected to the metallizations of the substrate by means of bonding wires.

FIG. 4 is a top view of a shunt resistor 10 being formed identically to the shunt resistor 10 shown in FIGS. 2A and 2B. The shunt resistor 10 is bonded to metallizations 51, 52 of a circuit carrier 50. Different from the arrangement shown in FIGS. 2A and 2B, the circuit carrier 50 comprises a third metallization 53 to which the first bonding area 21 is connected, and a fourth metallization 53. In order to determine the voltage drop over the resistance area 15, each of the bonding areas 21, 22 is connected with bonding wires 41 and 42, respectively, to the respective metallization 53 and 54 of the substrate. The metallizations 53 and 54 may be connected to a high-impedance voltage measuring device. The bonding wires 41, 42 may, e.g., consist of or comprise aluminum (Al), Copper (Cu), gold (Au), or an alloy comprising one of these materials, e.g. AlMg.

Figure 5:
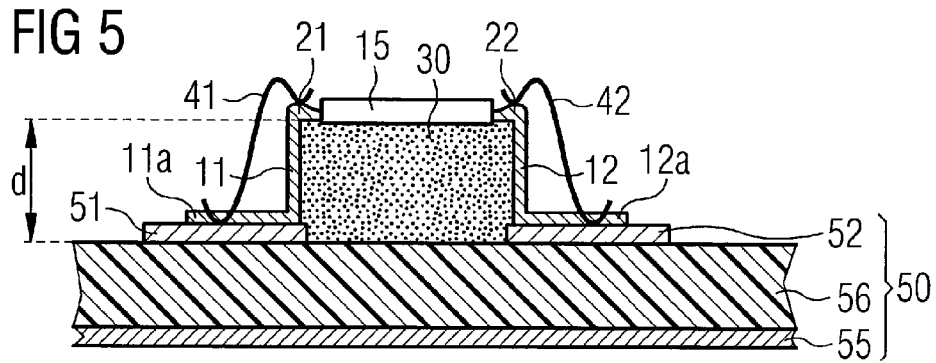
FIG. 5 is a cross sectional view of the arrangement of FIG. 4 in a section plane A-A', where a heat conductive filler is arranged between the resistance area and the circuit carrier.

In the arrangement shown in FIG. 5, which is a cross sectional view of the arrangement of FIG. 4 in a section plane A-A', a heat conductive filler 30 is arranged between the resistance area 15 and the substrate 50. The heat conductive filler 30 serves to dissipate heat from the resistance area 15 to the circuit carrier 50. The heat conductive filler 30, which may have a thermal conductivity selected according to eq. (1), e.g. typically between 1 $W \cdot K^{-1} \cdot m^{-1}$ and 50 $W \cdot K^{-1} \cdot m^{-1}$, may directly contact the substrate 50 and/or the resistance area 15.

Figure 6A:
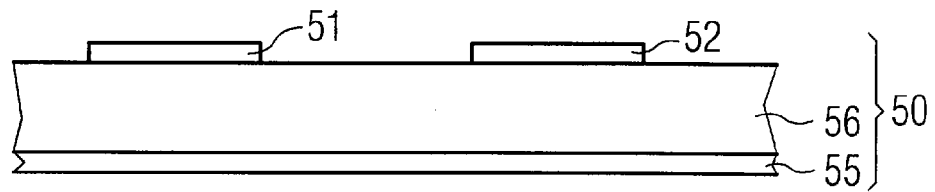
FIG. 6A is a side view of a circuit carrier to which a shunt resistor is to be joined.
Figure 6B:
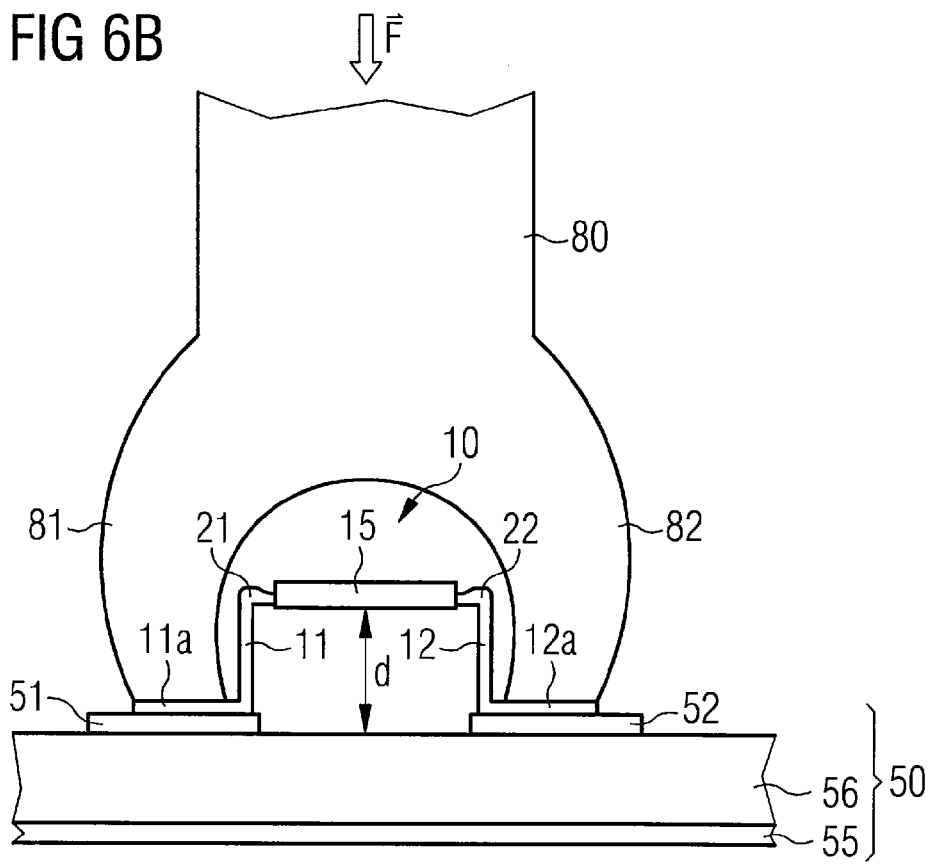
FIG. 6B is a side view of the circuit carrier of FIG. 6A, to which a shunt resistor is ultrasonic bonded by means of a bifurcated sonotrode.
Figure 6C:
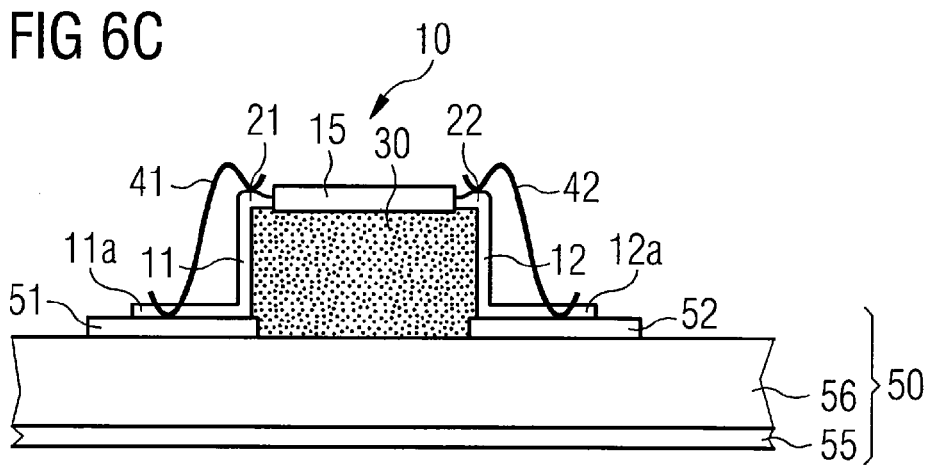
FIG. 6C is a side view of the shunt resistor of FIG. 6B after the bonding process, after arranging a heat conductive filler between the resistance area and the circuit carrier, and after electrically connecting the shunt resistor by means of bonding wires to metallizations of the circuit carrier.

FIGS. 6A to 6C are side views showing different steps of a first method for producing an arrangement comprising a circuit carrier 50, a shunt resistor 10 joined to the circuit carrier 50, and an heat conductive filler 30 arranged between the circuit carrier 50 and a resistance area 15 of the shunt resistor 10, as shown in FIG. 4. In a first step, a circuit carrier 50 comprising a dielectric substrate 56, top metallizations 51, 52 which are spaced distant from one another, and a bottom metallization 55, is provided. The substrate may consist of or comprise a ceramic material, e.g. $Al_2O_3$, which is a dielectric.

In a further step, the shunt resistor 10 is placed on the circuit carrier 50 such that the flange 11a of the first connecting leg 11 is arranged on the first metallization 51 and the flange 12a of the second connecting leg 12 is arranged on the second metallization 52. Optionally, the shunt resistor 10 is positioned on the circuit carrier 50 such that the flange 11a directly contacts with the first metallization 51 and that the flange 12a directly contacts with the second metallization 52. Alternative to a direct contact between the flanges 11a, 12a and a respective metallization 51, 52, at least one of the flanges 11a, 12a may remain distant from the metallization 51, 52 to which it is to be bonded.

Then, a sonotrode 80 applies a down force F to the connecting legs 11 and 12, e.g. to the flanges 11a, 12b thereof, and the shunt resistor 10 is pressed against the circuit carrier 50. Additionally to the down force F, the sonotrode provides ultrasonic waves which are transmitted to the flanges 11a and 12a which effects a strong joint between the connecting legs 11 and 12 and the respective metallizations 51, 52. As the sonotrode 80 is bifurcated and comprises two legs 81 and 82, the shunt resistor 10 may be ultrasonic bonded to the substrate 50 simultaneously in one bonding step.

In case of a shunt resistor 10 comprising more than two connecting legs 11, 12, the additional legs (see, e.g., the third and fourth connecting legs 13, 14 in FIGS. 1 and 3), the additional legs 13, 14 may be bonded to respective metallizations (see, e.g., the metallizations 53, 54 in FIG. 3) in the same way and/or simultaneously in the same bonding step as the first and second connecting legs 11 and 12, respectively.

After finishing the bonding process and after removing the sonotrode 80, the area between the circuit carrier 50 and the resistance area 15 may be filled with a heat conductive filler 30. For example, as filler 30 a ceramic paste comprising ceramic powder may be filled in under the resistance area 15.

In the example of FIGS. 6A to 6C, the filler 30 is arranged between the circuit carrier 50 and the resistance area 15 after bonding the shunt resistor 10 to the circuit carrier 50. In an alternative example, FIGS. 7A to 7E show different steps of a method in which the filler 30 is arranged between the circuit carrier 50 and the resistance area 15 prior to bonding the shunt resistor 10 to the circuit carrier 50.

Figure 7A:
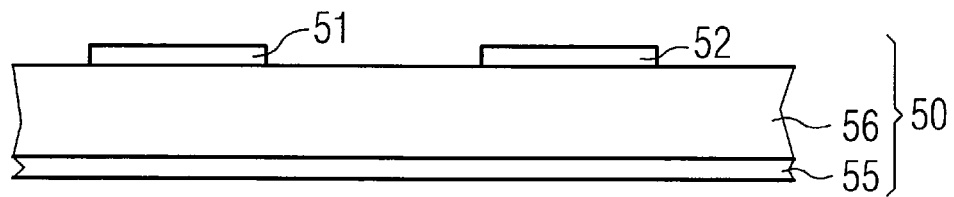
FIG. 7A is a side view of a circuit carrier to which a shunt resistor is to be joined.

In a first step shown in FIG. 7A, a circuit carrier 50 comprising a dielectric substrate 56, top metallizations 51, 52 which are spaced distant from one another, and a bottom metallization 55, is provided. The circuit carrier 50 be composed in the same way and/or from the same materials as the circuit carrier 50 of FIG. 6A.

Figure 7B:
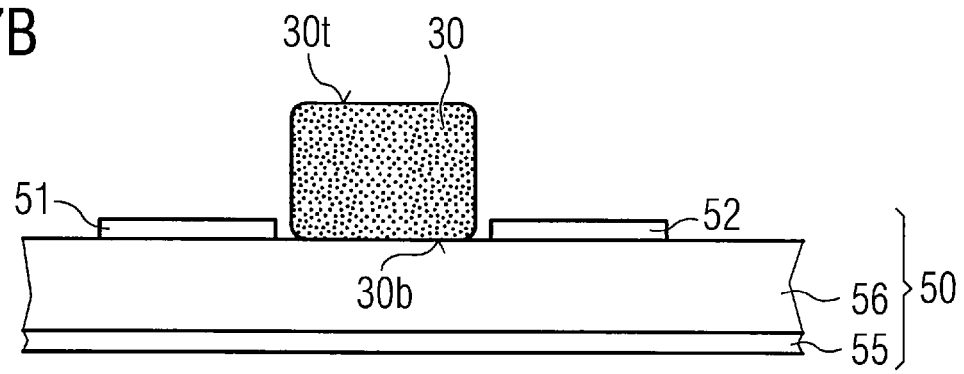
FIG. 7B is a side view of the circuit carrier of FIG. 7A on which a heat conductive material is arranged.

Then, as shown in FIG. 7B, a heat conductive filler 30, e.g. a sintered dielectric ceramic, is arranged on the circuit carrier 50. In FIG. 7B, the heat conductive filler 30 is arranged between the metallizations 51 and 52 such that it contacts with the substrate 56. Alternatively, the heat conductive filler 30 may be arranged on top of the border area of at least one of the metallizations 51, 52, and/or on top of a further metallization arranged between the metallizations 51, 52. For example, the heat conductive filler may be formed as inelastic cuboid body having a top face 30t and a bottom face 30b.

Figure 7C:
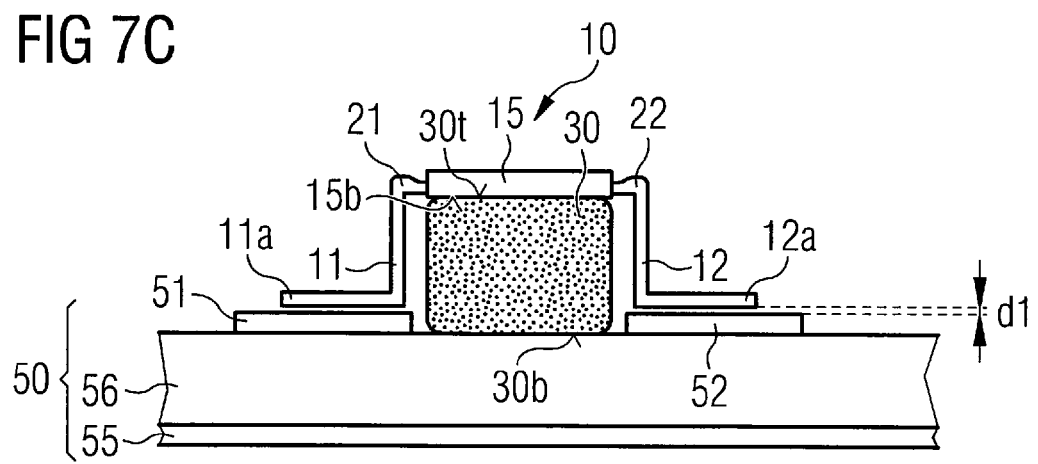
FIG. 7C is a side view of the arrangement of FIG. 7B, whereby a shunt resistor is arranged on the heat conductive material.

In a further step shown in FIG. 7C, the shunt resistor 10 is placed on the circuit carrier 50 such that a bottom face 15b of the resistance area 15 contacts with the top face 30t of the heat conductive filler 30. Moreover, the flange 11a of the first connecting leg 11 is arranged on or above the first metallization 51 and the flange 12a of the second connecting leg 12 is arranged on or above the second metallization 52. Depending on the geometries of the shunt resistor 10 and the heat conductive filler 30, at least one of the flanges 11a and 12a may have a distance d1 from the respective metallization 51, 52, when the bottom face 15b of the resistance area 15 contacts with the top face 30t of the heat conductive filler 30. Alternatively, at least one of the flanges 11a, 12a may directly contact with the respective metallization 51, 52, when the bottom face 15b of the resistance area 15 contacts with the top face 30t of the heat conductive filler 30.

Figure 7D:
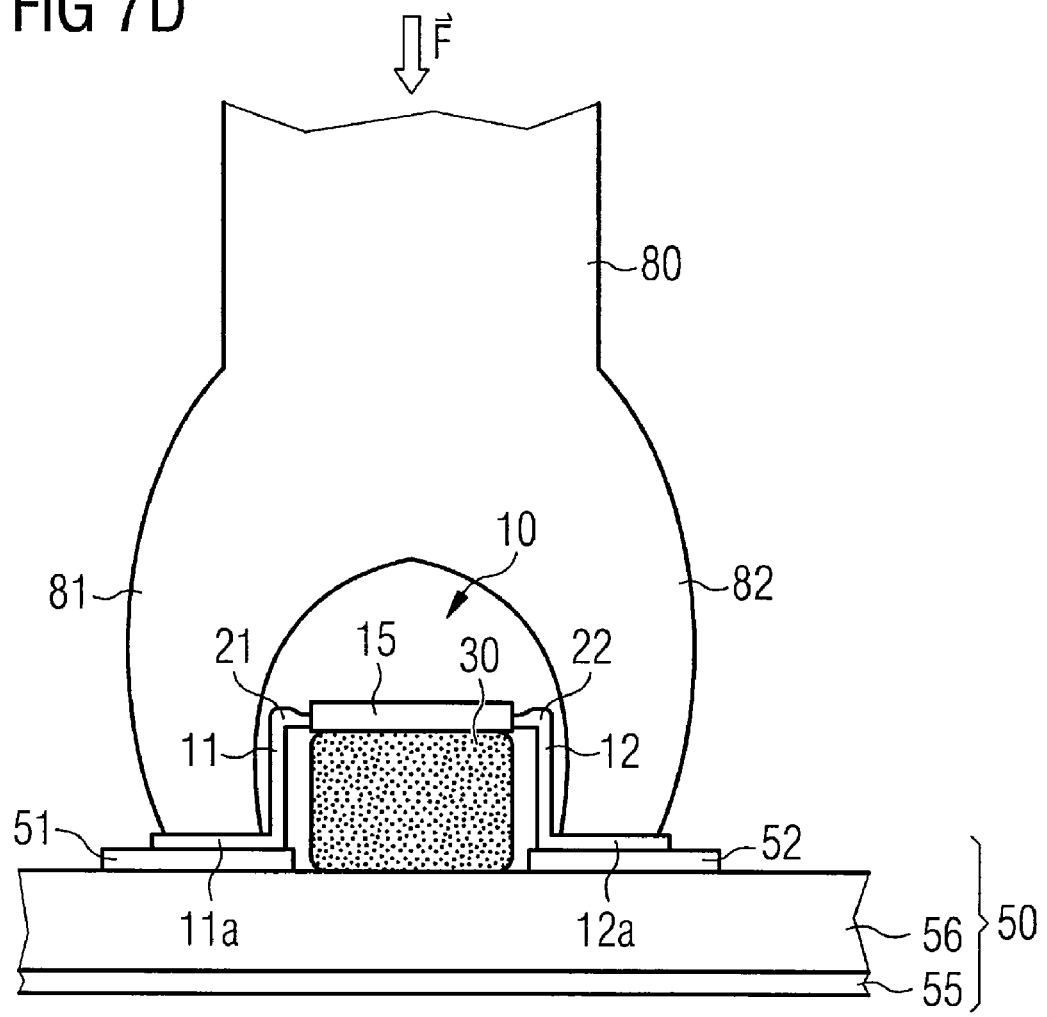
FIG. 7D is a side view of the arrangement of FIG. 7C during ultrasonic bonding the shunt resistor to the circuit carrier by means of a bifurcated sonotrode.
Figure 7E:
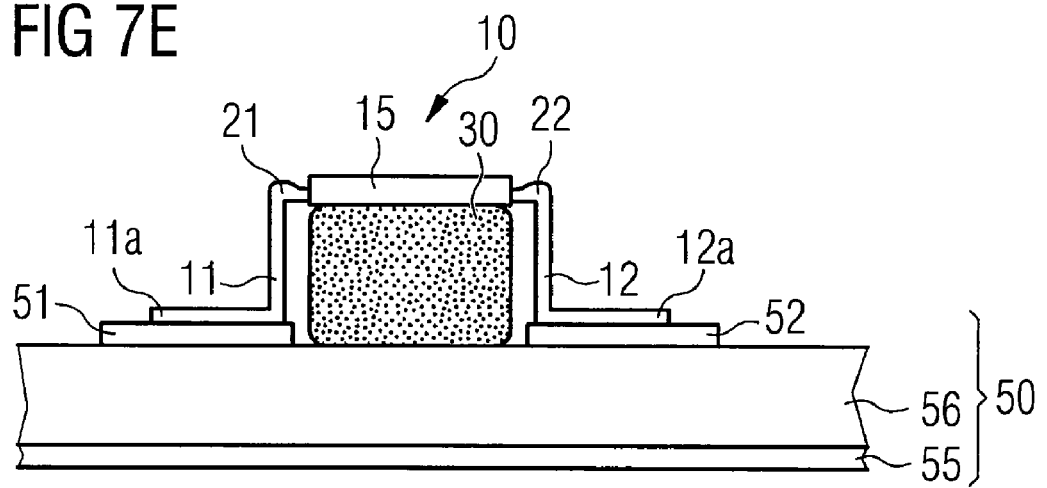
FIG. 7E shows the arrangement of FIG. 7D after removing the sonotrode.

As shown in FIG. 7D, the ends 81, 82 of a bifurcated sonotrode 80 applies a down force F to the connecting legs 11 and 12, e.g. to the flanges 11a, 12b thereof, such that the flanges 11a, 12a are pressed against the circuit carrier 50. Additionally to the down force F, the sonotrode provides ultrasonic waves which are transmitted to the flanges 11a and 12a which effects a strong joint between the connecting legs 11 and 12 and the respective metallizations 51, 52. As the sonotrode 80 is bifurcated and comprises the two legs 81 and 82, the shunt resistor 10 may be ultrasonic bonded to the substrate 50 simultaneously in one bonding step. As a result of the distance d1 between at least one of the flanges 11a, 12a and the respective metallization 51, 52 (see FIG. 7C) prior to the bonding process, during the bonding process the connecting legs 11, 12 are tensioned and serve as spring such that the resistance area 30 is pressed against the heat conductive filler 15, and the heat conductive filler 15 is pressed against the circuit carrier 50. This allows for cooling the resistance area 30 due to heat dissipation from the resistance area 30 to the circuit carrier 50. FIG. 7E shows the arrangement after the bonding process and after removing the sonotrode 80.

In the example of FIGS. 7A to 7E, a heat transfer from resistance area 15 to the circuit carrier 50 is enabled by a tension of the connecting legs 1, 12 pressing the resistance area 15 against a heat conductive filler 15 and the heat conductive filler 15 against the circuit carrier 50. In an alternative example shown in FIG. 8A, the resistance area 15 is pressed against the circuit carrier 50 such that it directly contacts with the circuit carrier 50.

Figure 8A:
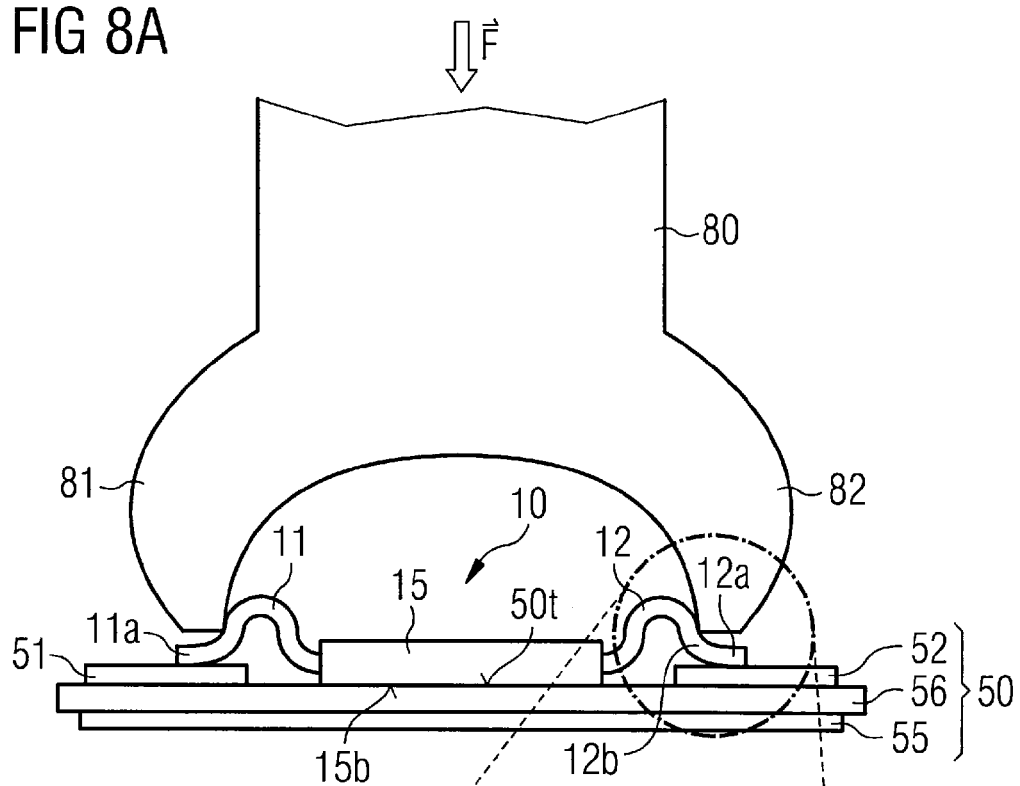
FIG. 8A is a side view of a shunt resistor comprising resilient connecting legs, which are to be pressed against a circuit carrier by means of a sonotrode for pretensioning the connecting legs and for bonding them to the circuit carrier.

In the arrangement of FIG. 8A, a circuit carrier 50 is provided. The circuit carrier 50 may be designed in the same way and/or be formed from the same materials as the circuit carrier 50 described in FIGS. 6A and 7A. A shunt resistor 10 comprising a first connecting leg 11, a second connecting leg 12, and a resistance area 15 arranged between the connecting legs 11, 12, is placed on the circuit carrier 50 such that a bottom face 15b of the resistance area 15 directly contacts with the top face of the circuit carrier 50. In FIG. 8A, the bottom face 15b of the resistance area 15 directly contacts with the substrate 56.

Figure 8B:
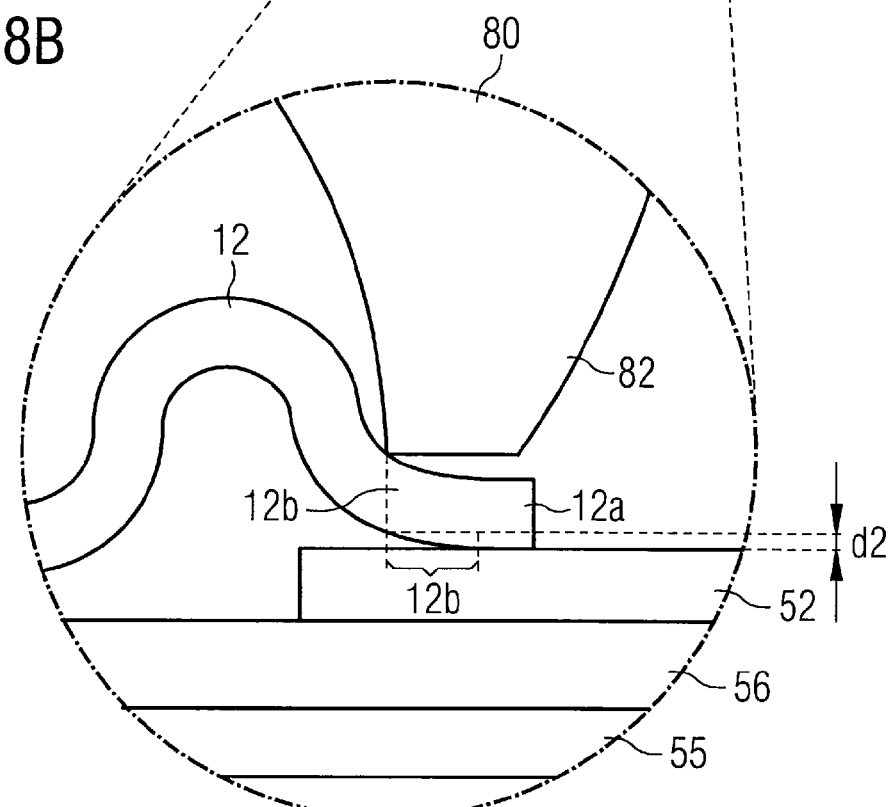
FIG. 8B is a magnified view of one of the connecting legs of FIG. 8A.
Figure 8C:
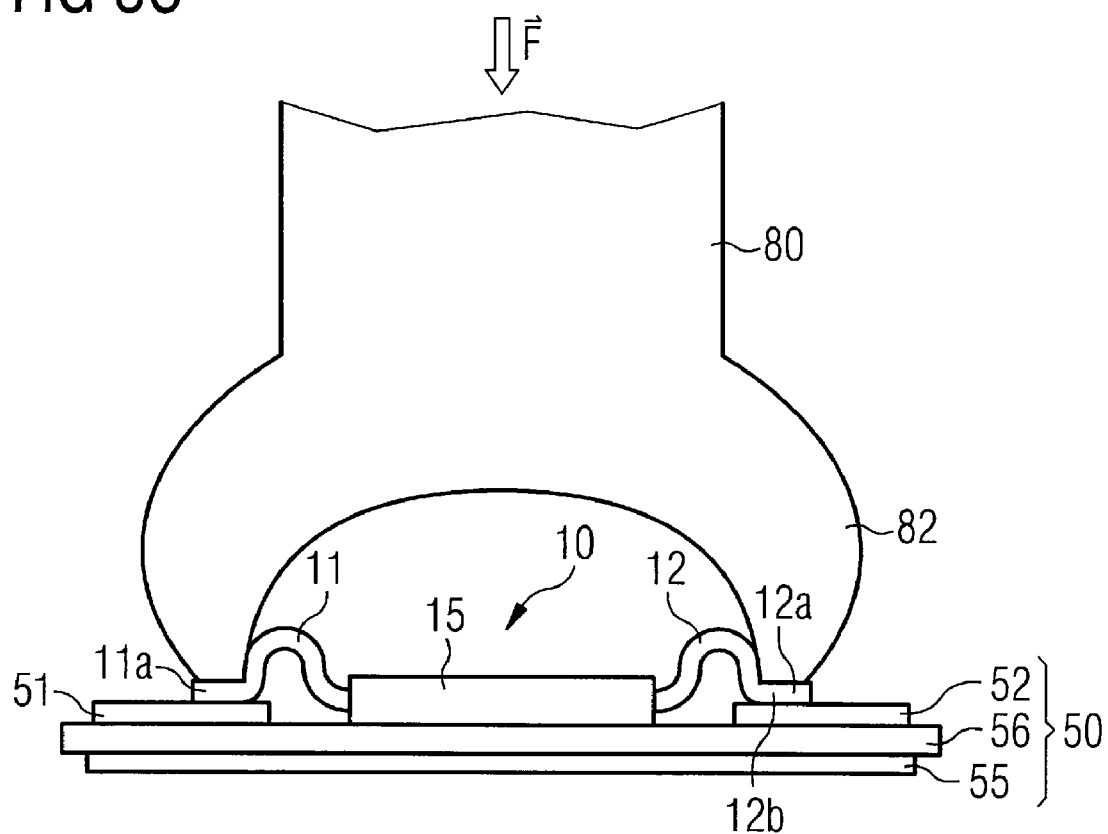
FIG. 8C is a side view of the arrangement of FIG. 8A where the resilient connecting legs are pressed against the circuit carrier by means of the sonotrode.
Figure 8D:
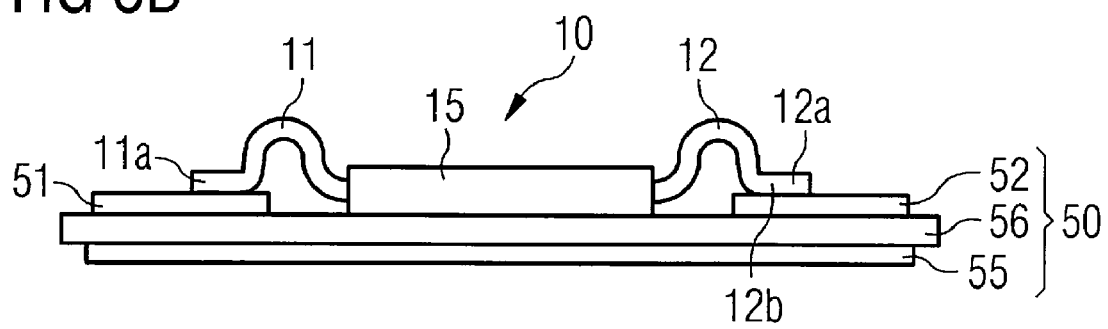
FIG. 8D is a side view of the arrangement of FIG. 8C after removing the sonotrode.

FIG. 8B is a magnified view of the designated bonding area between the second connecting leg 12 and the second metallization 52 shown in FIG. 8A. The second leg 82 of the bifurcated sonotrode 80 affects a section 12b of the second connecting leg 12, which section 12b has a distance d2 from the second metallization 52, when the bottom face 15b of the resistance area 15 contacts with the circuit carrier 15 (see FIG. 8A), particularly when the down force F is applied to section 12b. During the bonding process the sonotrode 80 presses the second connecting leg 12 against the circuit carrier 50, thereby decreasing the distance between the section 12b and the circuit carrier 50. Doing so causes a pretension of the second connecting leg 12 such that the resistance area 15 is pressed against the circuit carrier 50 as can be seen from FIG. 8C. In the same way, the first connecting leg 11 may be bonded to the first metallization 51 and thereby pretensioned. After joining the first connecting leg 11 with the first metallization 51 and after joining the second connecting leg 12 with the second metallization 52, the section 12b completely contacts with the second metallization 52. FIG. 8D shows the arrangement after removing the sonotrode 80 and after bonding wires 41, 42 to bonding areas 21 and 22, respectively, of the connecting legs 11 and 12, respectively.

In the arrangement shown in FIG. 8A, the free ends of the connecting legs 11, 12 contact with the metallization 51 and 52, respectively, when the bottom face 15b of the resistance area 15 contacts with the circuit carrier 15. Different from the steps described with reference to FIGS. 8A, 8B and 8C, the effect of pretensioning at least one of the connecting legs 11, 12 during the bonding process may also be achieved when the ends of the first and second connecting leg 11 and 12, respectively, do not contact with the respective metallization 51, 52 prior to applying the down force of the sonotrode to the connecting legs 11 and 12. This requires, in the case of a substantially flat top side of the circuit carrier 50 and prior to bonding, that the first and second connecting leg 11 and 12, respectively, do not extend up to or cross the plane B-B' of the bottom face 15b of the resistance area 15.

Figure 9:
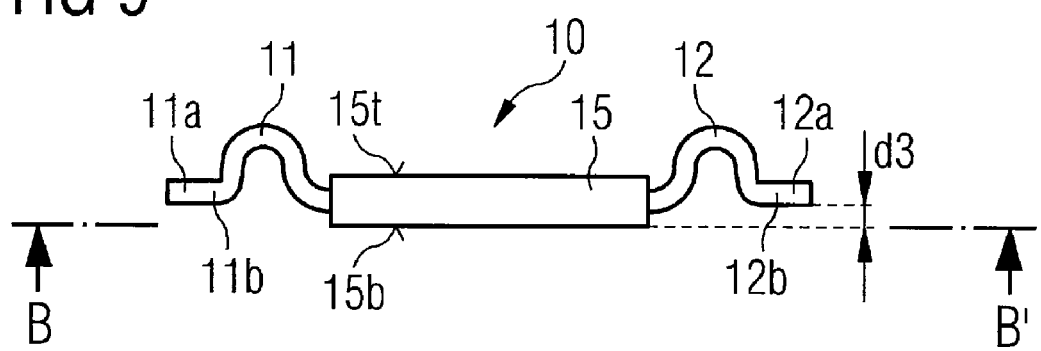
FIG. 9 is a side view of a shunt resistor comprising connecting legs, each comprising a flat flange arranged at the end of the respective connecting leg.

Such a shunt resistor 10 is shown in FIG. 9. The first and second connecting leg 11, 12 of the shunt resistor 10 have flanges 11a, 11b arranged at the free end of the respective connecting leg 11, 12. In a direction perpendicular to the bottom face 15b of the resistance area 15, the flanges 11a, 11b are spaced distant from the plane B-B' of the bottom face 15b at distances d3. For example, the flanges 11a, 12a may have plane bottom faces 11b and 12b, respectively, running parallel to the plane B-B'.

Figure 10:
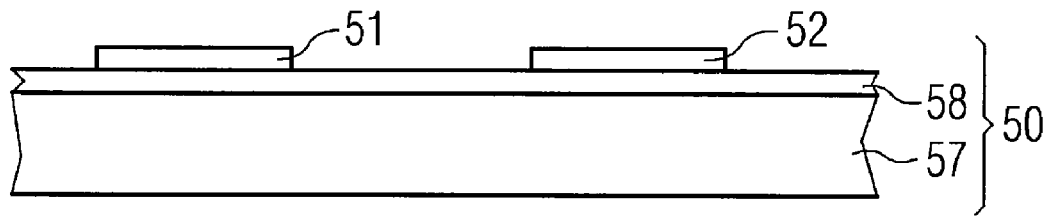
FIG. 10 is a side view of a circuit carrier in this example designed as insulated metal substrate.

In the previous examples, a circuit carrier 50 based on a dielectric ceramic substrate 56 has been described. However, the present invention also refers any other circuit carrier 50 comprising metallizations 51, 52. For example, a circuit carrier 50 may be formed as insulated metal substrate (IMS substrate). An example of such a circuit carrier 50 based on IMS technology is shown in FIG. 10. The circuit carrier 50 comprises a metal layer 57 supporting an insulating layer 58. On the insulation layer 58, two metallizations 51, 52 are arranged. The metal layer 57 consists of or comprises metal or an alloy comprising at least one metal, e.g. aluminum or copper. The insulation layer 58 electrically insulates the metallizations 51, 52 from metal layer 57 and may be made of, e.g., epoxy.

As described above, one aspect of the present invention is to simultaneously join two or more connecting legs of a shunt resistor to a circuit carrier by use of a bifurcated sonotrode. This technique may also apply to arrangements, in which a shunt resistor is bonded to a circuit carrier without a heat conductive filler arranged between the resistance area and the circuit carrier, and without the resistance area directly contacting with the circuit carrier. Further, instead of a joint formation by ultrasonic bonding the arrangements described above could also be manufactured by ultrasonic welding technique, by HF-welding technique, by laser welding technique, by spot welding technique, or by rotary friction welding technique.

Although various examples to realize the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

The invention claimed is:

1. An arrangement comprising:
    a shunt resistor comprising at least an electrically conductive first connecting leg, an electrically conductive second connecting leg, and a resistance area electrically connected to the first connecting leg and to the second connecting leg;
    a circuit carrier comprising a first metallization and a second metallization;
    wherein the first connecting leg is joined to the first metallization and the second connecting leg is joined to the second metallization; and
    wherein the resistance area directly contacts with the circuit carrier and/or where a heat conductive filler is arranged between the circuit carrier and the resistance area.

2. The arrangement of claim 1, wherein the heat conductive filler is arranged between the circuit carrier and the resistance area and contacts with the circuit carrier.

3. The arrangement of claim 1, wherein the heat conductive filler is arranged between the circuit carrier and the resistance area and contacts with the resistance area.

4. The arrangement of claim 1, wherein the heat conductive filler is arranged between the circuit carrier and the resistance area and comprises a thermal conductivity of greater than 1 $W \cdot K^{-1} \cdot m^{-1}$.

5. The arrangement of claim 1, wherein the heat conductive filler is arranged between the circuit carrier and the resistance area and comprises at least 50% by weight of ceramic material.

6. The arrangement of claim 1, wherein the resistance area is pressed against the circuit carrier by the effect of a spring tension of at least one of the first connecting and the second connecting legs.

7. The arrangement of claim 1, wherein the circuit carrier comprises a substrate made of ceramic material.

8. The arrangement of claim 1, wherein the circuit carrier comprises an isolated metal substrate.

9. The arrangement of claim 1, wherein the first connecting leg is directly joined to the first metallization and/or where the second connecting leg is directly joined to the second metallization.

10. An arrangement comprising:
    a shunt resistor comprising at least an electrically conductive first connecting leg, an electrically conductive second connecting leg, and a resistance area electrically connected to the first connecting leg and to the second connecting leg;
    a circuit carrier comprising a first metallization and a second metallization;

wherein the first connecting leg is directly joined to the first metallization and the second connecting leg is directly joined to the second metallization; and wherein the shunt resistor further comprises a first bonding area arranged between the first connecting leg and the resistance area.

11. The arrangement of claim 10, further comprising a first bonding wire bonded to a third metallization of the circuit carrier and to the first bonding area.

12. The arrangement of claim 10, wherein the first bonding area is formed by a plane surface section of the first connecting leg.

13. The arrangement of claim 12, wherein the plane surface section of the first connecting leg runs parallel to the circuit carrier.

14. The arrangement of claim 12, wherein the plane surface section of the first connecting leg comprises an area ranging from 0.1 mm×0.1 mm to 0.8 mm×2.0 mm.

15. The arrangement of claim 11, further comprising a second bonding area arranged between the second connecting leg and the resistance area.

16. The arrangement of claim 15, further comprising a second bonding wire bonded to a fourth metallization of the circuit carrier and to the second bonding area.

17. The arrangement of claim 15, wherein the second bonding area is formed by a plane surface section of the second connecting leg.

18. The arrangement of claim 12, wherein the plane surface section of the second connecting leg runs parallel to the circuit carrier.

19. The arrangement of claim 17, wherein the plane surface section of the second connecting leg comprises an area ranging from 0.1 mm×0.1 mm to 0.8 mm×2.0 mm.

20. A method for joining a shunt resistor and a circuit carrier, the method comprising the steps:

providing a shunt resistor comprising at least an electrically conductive first connecting leg, an electrically conductive second connecting leg, and a resistance area electrically connected to the first connecting leg and to the second connecting leg;

providing a circuit carrier comprising a first metallization and a second metallization;

positioning the shunt resistor on the circuit carrier such that the first connecting leg contacts with the first metallization and that the second connecting leg contacts with the second metallization;

joining the first connecting leg with the first metallization and joining the second connecting leg with the second metallization by use of an ultrasonic bonding technique.

21. The method of claim 20 where the step of joining comprises the sub step of providing a bifurcated sonotrode.

22. The method of claim 20 where joining the first connecting leg with the first metallization and joining the second connecting leg with the second metallization by use of an ultrasonic bonding technique takes place simultaneously.

23. The method of claim 20 comprising the step of providing a heat conductive filler and arranging the heat conductive filler between the circuit carrier and the resistance area.

24. The method of claim 23 where the step of arranging the heat conductive filler takes place prior to the step of joining the first connecting leg with the first metallization and joining the second connecting leg.

25. The method of claim 23 where the step of arranging the heat conductive filler takes place after the step of joining the first connecting leg with the first metallization and joining the second connecting leg.

26. The method of claim 18 where the heat conductive filler comprises a thermal conductivity of greater than $1 \ W \cdot K^{-1} \cdot m^{-1}$.

27. The method of claim 20 where the resistance area is directly contacted with the circuit carrier.

28. The method of claim 20 where a down force is applied to at least one section of at least one of the first connecting leg and the second connecting leg, where, when the down force starts to affect the at least one section, the at least one section is distant from the circuit carrier.

29. The method of claim 28 where, after joining the first connecting leg with the first metallization and after joining the second connecting leg with the second metallization, the at least one section completely contacts with the first or second metallization.

* * * * *